(12) United States Patent
Tanabe

(10) Patent No.: US 6,333,526 B1
(45) Date of Patent: Dec. 25, 2001

(54) CHARGE TRANSFER DEVICE AND A MANUFACTURING PROCESS THEREFOR

(75) Inventor: Akihito Tanabe, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/198,361

(22) Filed: Nov. 24, 1998

(30) Foreign Application Priority Data

Nov. 27, 1997 (JP) .................................................. 9-326225

(51) Int. Cl.$^7$ ....................... H01L 27/148; H01L 29/765; H01L 29/768
(52) U.S. Cl. ............................................. 257/227; 257/221
(58) Field of Search .................................. 257/219, 221, 257/227

(56) References Cited

U.S. PATENT DOCUMENTS

| | | | | |
|---|---|---|---|---|
| 5,159,419 | * | 10/1992 | Hosack | 257/225 |
| 5,548,142 | * | 8/1996 | Arakawa | 257/234 |
| 5,581,099 | * | 12/1996 | Kusaka et al. | 257/222 |
| 5,828,091 | * | 10/1998 | Kawai | 257/218 |
| 6,043,523 | * | 3/2000 | Park et al. | 257/239 |

FOREIGN PATENT DOCUMENTS

| | | |
|---|---|---|
| 57-7964 | 1/1982 | (JP) . |
| 3-148137 | 6/1991 | (JP) . |
| 4-186980 | 7/1992 | (JP) . |

* cited by examiner

Primary Examiner—Allan R. Wilson
(74) Attorney, Agent, or Firm—Foley & Lardner

(57) ABSTRACT

This invention provides a manufacturing process for a charge transfer device comprising an N-type well formed in a P-type well on a semiconductor substrate for transferring a signal charge, an N+region formed on both sides along the charge transfer direction of the N-type well and containing a dopant in a higher concentration than that in the N-type well, a P-type region formed around the N+ region, and a gate electrode covering the N+ region and the N-type well and formed via a gate insulator, comprising ion-implanting an N-type dopant into the region to be the N-type well and the N+ region using the first mask and ion-implanting a P-type dopant into the region to be the N-type well using the second mask. Thus, there can be provided a charge transfer device which has a structure where there is an N+ region on both sides of the N-type well, a large maximum transferable charge and a compact CCD with a width up to 3 times the minimum design dimension.

4 Claims, 11 Drawing Sheets

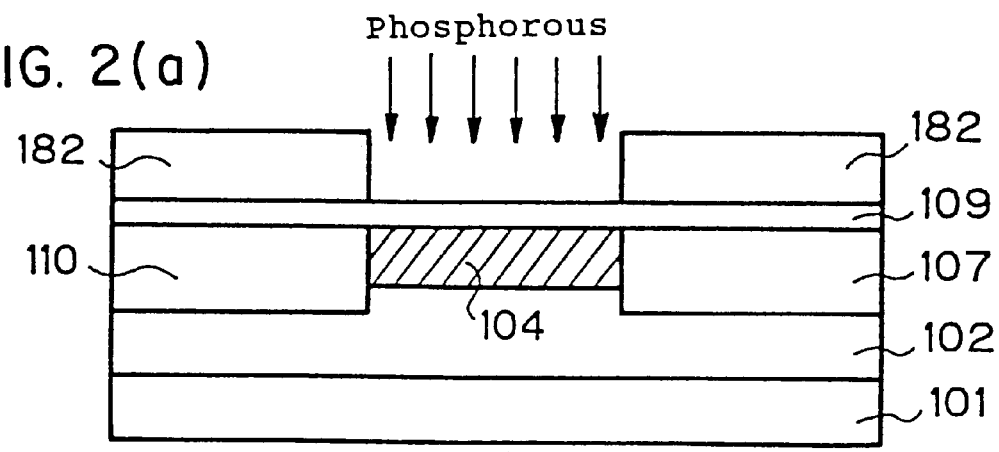
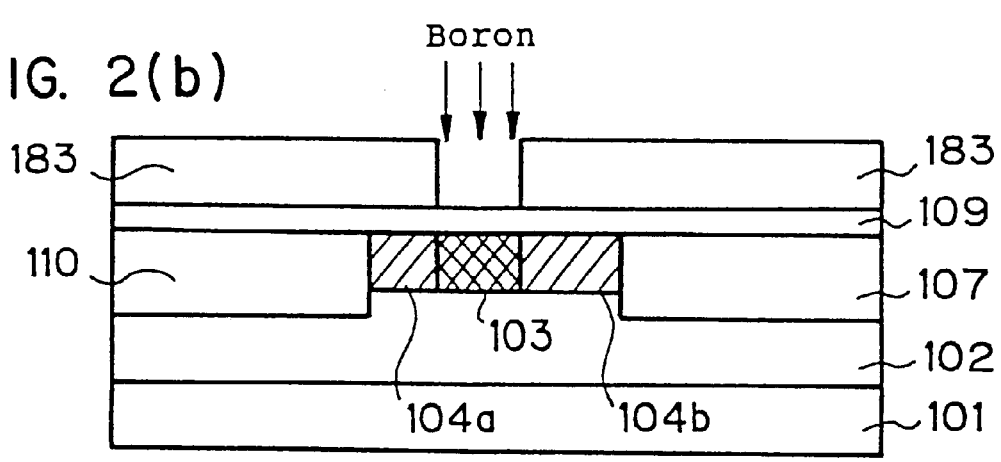
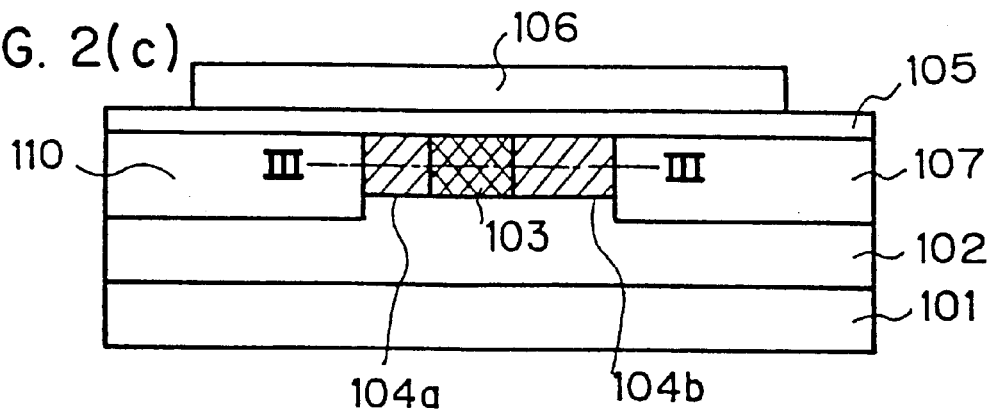

CHARGE TRANSFER DEVICE AND A MANUFACTURING PROCESS THEREFOR

BACKGROUND OF THE INVENTION

1. Field of the Invention

This invention relates to a charge transfer device for use in, for example, a solid-state image sensor or a delay element, and a manufacturing process therefor.

2. Description of the Related Art

A conventional charge transfer device for use in, for example, a solid-state image sensor or a delay element is shown in FIGS. 6. FIGS. 6(a), 6(b), and 6(c) respectively are a schematic plan view, a schematic cross section taken on line VI(b)—VI(b) of FIG. 6(a), and a schematic cross section taken on line VI(c)–VI(c), which are disclosed in JP-A 57-7964.

In an n-type silicon substrate 1, there is a p-type well 2, in which there is an n-type well 3 in which a charge transfer channel is to be formed. There are n+ regions 4 containing an n-type dopant at a higher concentration than that in the n-type well 3, on both sides of the n-type well 3 along its charge transfer direction (the direction of line X–X' in the FIG.), and around the n+ region 4, a p+ channel stopper 7 is formed. On the n-type well 3 and the n+ region 4, there are a number of gate electrodes 6 via a gate insulator 5 consisting of, for example, an oxide film such as $SiO_2$.

FIG. 7 shows an electric potential distribution along line Z–Z' of FIG. 6(c), i.e., the depth direction, where a lower position has a higher potential. In this figure, the origin of the depth direction is the silicon/gate insulator interface, and as a specific example, 0 V is applied to the p+ channel stopper 7 and the p-type well 2 and a lower(VL) or higher voltage(VH) to the gate electrode 6. To the n-type silicon substrate 1, a voltage with a reverse bias to the p-type well 2 is applied. The highest potential in the potential distribution along the depth direction shown in FIG. 7, is referred to as a "channel potential".

When a higher voltage(VH) is applied to a gate and a lower voltage(VL) is to two adjacent gates, electrons are transferred to beneath the gate electrode to which the VH is applied, causing a potential reduction. The potential may be reduced to the channel potential of the adjacent gate electrodes to which the VL is applied. The dotted line in this figure indicates the potential distribution at this time. An electric charge which may cause the potential change is the maximum transferable charge.

By reference to FIGS. 8(a), 8(b), and 8(c), a process for charge transfer in the charge transfer device shown in FIGS. 6(a)–6(c) will be described. FIG. 8(a) is the same schematic cross section as that shown in FIG. 6(b). FIG. 8(b) shows a channel potential distribution along line VIII(b)–VIII(b) of FIG. 8(a) at each time indicated in FIG. 8(c). FIG. 8(c) shows timing of a voltage pulse applied to the gate electrode of the charge transfer device. FIGS. 8(a) and 8(b) are depicted in a manner that they horizontally have the same position, and in FIG. 8(b) a lower position has a higher potential. To electrodes 4V1 to 4V4 is applied a binary pulse varying between the higher(VH) and the lower(VL) voltages as shown in FIG. 8(c).

The lower voltage is a voltage(pinning voltage) by which positive holes are stored in the silicon/oxide film interface to make the interface potential 0 V. In this manner, a dark current occurring via a silicon/oxide film interface level may be minimized.

The higher voltage is a voltage which is below the channel potential when the lower voltage is applied. Thus, a transferred charge does not reach the silicon/oxide film interface even when a maximum transferable charge (Qmax) is transferred, and is not trapped on the interface level. The charge can be, therefore, transferred without reduction of a transfer efficiency.

First, at time T1, the higher voltage (VH) is applied to φV1 and φV2 electrodes, and the channel potential increases beneath the electrodes, to cause charge storage. The stored charge is indicated by the slanted line in FIG. 8(b). At time T2, φV3 is at the higher voltage (VH) while φV1 at the lower voltage (VL), and thus, a charge is transferred to beneath the electrodes φV2 and φV3. In a similar manner, at T3 and T4, a charge is transferred to beneath electrodes φV3 and φV4 and electrodes φV4 and φV1, respectively. Then, at T5, a charge is transferred to beneath electrodes φV1 and φV2, returning to the state at T1 except that a charge is moved to the right, i.e., beneath the electrodes φV1 and φV2. By repeating the above process, a charge is sequentially transferred to the right direction. Such charge transfer is indicated by a right oblique downward arrow in FIG. 8(b).

Next, the reason why the maximum transferable charge (Qmax) is increased by the charge transfer device shown in FIGS. 6(a)–6(c), will be described. FIG. 9(a) is a cross section taken on line IX(a)–IX(a) of FIG. 6(a). FIG. 9(b) shows a channel potential distribution along line IX(b)–IX(b) of FIG. 9(a) when a lower (VL) or higher (VH) voltage is applied, where the dotted line indicates a distribution for a charge transfer device without an n+ region. FIG. 9(a) shows a capacity at the local maximum of the potential (channel position) in the n-type well 3 when a voltage VG is applied to the gate electrode. A capacity between the channel position and the gate electrode (Cs) is the sum of serial connection of the gate insulator capacity and the capacity in the silicon from the silicon/gate insulator interface to the channel position. A capacity of both sides (Ccs) is one between the channel position and the p+ channel stopper 7. A capacity below the channel position (Cb) is one between the channel position and the p-type well 2.

When a voltage VG is applied to the gate electrode and 0 V is to the p+ channel stopper 7 and the p-type well 2, relationship between a variation of the channel potential Δφch and a variation of the gate voltage ΔVG can be represented by the following equation:

$$\Delta\phi ch = \Delta VG \cdot Cs/(Cs + 2Ccs + Cb)$$

A charge stored beneath the gate electrode can be substantially represented by the following equation:

$$\Delta Q = \Delta\phi ch \cdot (Cs + 2Ccs + Cb) \qquad (1)$$
$$= \Delta VG \cdot Cs$$

A value obtained by integrating the above Equation (1) with the variation (amplitude) of the gate electrode is the maximum transferable charge (Qmax). It will be understood that when the amplitude is constant, a larger Cs gives a larger Qmax.

The solid line in FIG. 9(b) indicating the channel potential distribution along line V–V' when a lower (VL) or higher (VH) voltage is applied to the gate electrode, will be referred. The horizontal position is matched with the corresponding position in FIG. 9(a).

A concentration and a width in the n+ region 4 is adjusted so that when the lower voltage (VL) is applied, the curved channel potential line is changed within the n+ region 4 to be straight throughout the n-type well 3. When the higher voltage (VH) is applied, a depletion layer formed by p-n junction between the p+ channel stopper 7 and the n+ region 4 is extended to enter the n-type well 3. The straight part of the channel potential is, therefore, shorter than one when the lower voltage (VL) is applied. A capacity between the straight part of the channel potential and the gate electrode is Cs, which contributes a charge as indicated by Equation (1). On the other hand, the n+ region 4 forms p-n junction with the p+ channel stopper 7, and a potential increases from 0 V on the stopper side to φch. The capacity of this part is Ccs, which does not contribute charge according to Equation (1). Increase of the straight part of the channel potential, therefore, leads to increase of Qmax.

In FIG. 9(b), the dotted line indicates a channel potential distribution along line V–V' when without the n+ region 4, a lower (VL) or higher (VH) voltage is applied to the gate electrode. Since in this case, a concentration of the n-type dopant is lower than that in the n+ region, the curve of the channel potential is gentler around both ends, and thus the straight part of the channel potential is shorter.

As described above, increase of Qmax in the charge transfer device in FIGS. 6(a)–6(c) is owing to the fact that the device has the n+ region, leading to a steeper curve (rate of change) of the channel potential around both ends and increase in the straight part of the channel potential.

Next, a manufacturing process for the charge transfer device shown in FIGS. 6(a)–6(c) will be described. FIGS. 10(a)–10(d) are schematic cross-sectional process views, showing each manufacturing step with a cross section taken along line VI(c)–VI(c) of FIG. 6(a).

First, boron is ion-implanted with an energy of 150 to 200 kev and a dosage of 1 to $5 \times 10^{12}/cm^2$ on the surface of an n-type of silicon substrate 1 having a phosphorous concentration of an order of $10^{14}/cm^3$; a p-type well 2 is formed by heating at 1200° C. for 30 min to 2 hours; and then an oxide film 9 is formed by wet oxidation at 900° C. for about 7 min. As shown in FIG. 10(a), on the film a photoresist 81 is formed with a thickness of about 2 μm by a photolithography technique and then boron is ion-implanted with an energy of 20 to 40 keV and a dosage of 1 to $5 \times 10^{13}/cm^2$, to form a p+ channel stopper 7.

Next, after removing the photoresist 81, a photoresist 82 with a thickness of about 2 μm as shown in FIG. 10(b), and then phosphorous is ion-implanted with an energy of 70 to 150 keV and a dosage of 1 to $5 \times 10^{12}/cm^2$, to form an n-type well 3.

Then, after removing the photoresist 82, photoresists 83a and 83b with a thickness of about 2 μm are formed and ions are implanted to both sides of the n-type well 3, with the same energy as that for the above n-type well 3 and with a dosage 0.2 to 2 times as high as that for the n-type well 3, to form an n+ region 4.

Then, after removing the photoresist, the substrate is heated at 950 to 980° C. for 30 min to 1 hour under an atmosphere of nitrogen, to activate the ion-implanted dopant, and then the oxide film 9 is wet-etched with hydrofluoric acid.

Then, as shown in FIG. 10(d), a gate insulator 5 is formed by wet oxidation at 900 to 980° C. for 5 to 30 min, on which a polysilicon gate electrode 6 doped with a dopant by lithography and etching, to provide a charge transfer device as shown in FIGS. 6(a)–6(c).

However, if the conventional charge transfer device as shown in FIGS. 6(a)–6(c) is prepared by the above manufacturing process as shown in FIGS. 10(a)–10(d), reduction in the width of the n-type well gives the narrower photoresist 83a in FIG. 10(c), causing peeling or falling of the photoresist. As an example in which the problem may be prominent, an interlined type of two-dimensional CCD image sensor will be described.

FIG. 11 schematically shows an interline type of CCD image sensor. Adjacent to each photodiode array which is two-dimensionally aligned, a vertical CCD 12 is formed, which is connected with the photodiodes 10 via transfer gates 11. There are provided p+ channel stoppers 15, for example, between photodiodes 10, between a photodiode 10 and the vertical CCD 12 as well as between a photodiode 10 and horizontal CCD 13. The lower end of each vertical CCD 12 is connected with the horizontal CCD 13, an end of which is connected with an amplifier 14. A signal charge which has been obtained by photo electric conversion is read out to the vertical CCD 12 via the transfer gates 11, then transferred at the vertical CCD 12 and the horizontal CCD 13, and then amplified by the amplifier 14 to be output. The region enclosed by the dotted line in the figure is a unit pixel 16, whose size has been recently reduced as a two-dimensional CCD image sensor has have a reduced size of chip and more pixels.

However, it is desirable to increase the area of the photodiode 10 as much as possible for ensuring a certain sensitivity or capacity of the photodiode. To this end, it is desired that a transfer charge per a unit area of the vertical CCD 12 is increased to reduce the area of the vertical CCD 12.

If the charge transfer device shown in FIGS. 6(a)–6(c) is applied to a vertical CCD for solving the problem, there may be difficulty in the above manufacturing process as shown in FIGS. 10(a)–10(d), due to the fact that as the n-type well 3 becomes narrower, the photoresist 83a becomes narrower. In an interline type of two-dimensional CCD image sensor, a pixel has been gradually miniaturized and the minimum pixel reported to date corresponds to a square whose sides have a length of about 4 to 5 μm. In the sensor, the vertical CCD has a width of below 1.5 μm, which is the distance between the p+ channel stoppers 7 in FIGS. 10(a)–10(d). An opening of the photoresist shown in FIG. 10(c) whose minimum design dimension is 0.5 μm, has a dimension of 0.5 μm, and the width of the photoresist 83a is below 0.5 μm. In an optical format of ½ inch, the length of the vertical CCD is below about 5 mm, and therefore, the photoresist 83a is stripe-shaped with a width of below 0.5 μm and a length of 5 mm. Such a shape is likely to cause peeling or falling due to inadequate adhesion of the photoresist, which may be prominent when the width of the vertical CCD is further reduced. Because of the above problems, it has been very difficult to prepare a charge transfer device whose vertical CCD width is below 1.5 μm, in the shape shown in FIGS. 6(a)–6(c), according to the process of the prior art.

SUMMARY OF THE INVENTION

In the light of the above description, an objective of this invention is thus to provide a charge transfer device which has a structure shown in FIGS. 6(a)–6(c), a large maximum transferable charge and a compact CCD with a width of below 1.5 μm (up to 3 times the minimum design dimension), without using a narrow and long photoresist pattern which is likely to cause peeling or falling as described above.

We have attained this invention by intensively attempting to achieve the above objective.

This invention provides a manufacturing process for a charge transfer device comprising a well of second conduction type formed in a well of first conduction type on a semiconductor substrate for transferring a signal charge, a region of second conduction type formed on at least one of both sides along the charge transfer direction of the well of second conduction type and containing a dopant in a higher concentration than that in the well of second conduction type, a region of first conduction type formed around the region of second conduction type or the well of second conduction type, and a gate electrode covering at least the well of second conduction type and the region of second conduction type and formed via a gate insulator, comprising at least ion-implanting a dopant of second conduction type of into the region to be the well of second conduction type and the region of second conduction type using the first mask and ion-implanting a dopant of first conduction type into the region to be the well of second conduction type using the second mask.

This invention further provides a manufacturing process for a charge transfer device comprising a well of second conduction type formed in a well of first conduction type on a semiconductor substrate for transferring a signal charge, a region of second conduction type formed on one side along the charge transfer direction of the well of second conduction type and containing a dopant in a higher concentration than that in the well of second conduction type, a region of first conduction type formed around each of the region of second conduction type and the well of second conduction type, and a gate electrode covering at least the well of second conduction type and the region of second conduction type and formed via a gate insulator, comprising at least ion-implanting a dopant of second conduction type into the region to be the well of second conduction type and the region of second conduction type using a mask, and ion-implanting a dopant of first conduction type from a direction tilted from the normal line of the substrate face to one direction unparallel to the charge transfer direction, at predetermined dosage and energy using the above mask.

This invention further provides a manufacturing process for a charge transfer device comprising a well of second conduction type formed in a well of first conduction type on a semiconductor substrate for transferring a signal charge, a region of second conduction type formed on both sides along the charge transfer direction of the well of second conduction type and containing a dopant in a higher concentration than that in the well of second conduction type, a region of first conduction type formed around the region of second conduction type, and a gate electrode covering at least the well of second conduction type and the region of second conduction type and formed via a gate insulator, comprising at least ion-implanting a dopant of second conduction type into the region to be the well of second conduction type and the region of second conduction type using a mask, ion-implanting a dopant of first conduction type from the first direction tilted from the normal line of the substrate face to the direction unparallel to the charge transfer direction, at the first dosage and the first energy using the above mask, and ion-implanting a dopant of first conduction type from the second direction tilted from the normal line of the substrate face to the direction unparallel to the charge transfer direction, at the second dosage and the second energy using the above mask.

This invention further provides a charge transfer device comprising a well of second conduction type formed in a well of first conduction type on a semiconductor substrate for transferring a signal charge, a region of second conduction type formed on at least one of both sides along the charge transfer direction of the well of second conduction type and containing a dopant in a higher concentration than that in the well of second conduction type of, a region of first conduction type formed around the region of second conduction type or the well of second conduction type, and a gate electrode covering at least the well of second conduction type and the region of second conduction type and formed via a gate insulator, wherein the sum of the widths of the well of second conduction type and the region of second conduction type is up to three times as large as the minimum design dimension.

This invention further provides a charge transfer device comprising a well of second conduction type formed in a well of first conduction type on a semiconductor substrate for transferring a signal charge, a region of second conduction type formed on both sides along the charge transfer direction of the well of second conduction type and containing a dopant in a higher concentration than that in the well of second conduction type, regions of first conduction type having different dopant concentrations formed around the region of second conduction type, and a gate electrode covering at least the well of second conduction type and the region of second conduction type and formed via a gate insulator, wherein the region of second conduction type on the side of the region of first conduction type with a lower dopant concentration is narrower than the other region of second conduction type.

This invention further provides a charge transfer device comprising a well of second conduction type formed in a well of first conduction type on a semiconductor substrate for transferring a signal charge, a region of second conduction type formed on both sides along the charge transfer direction of the well of second conduction type and containing a dopant in a higher concentration than that in the well of second conduction type, regions of first conduction type having different dopant concentrations formed around the region of second conduction type, and a gate electrode covering at least the well of second conduction type and the region of second conduction type and formed via a gate insulator, wherein the region of second conduction type on the side of the region of first conduction type with a lower dopant concentration has a lower dopant concentration than that of the other region of second conduction type.

In the manufacturing process for a charge transfer device of this invention, for example, an n-type dopant is ion-implanted to the region to be an n-type well and an n+ region from an opening of the first photoresist, and a. p-type dopant is ion-implanted to the region to be an n-type well from an opening of the second photoresist. As a result, a narrow and long photoresist pattern in which peeling or falling is likely to occur may not be formed and the width of the n+ region depends on the distance between the end of the photoresist opening and the p+ channel stopper, and may be thus smaller than the minimum design dimension. Therefore, a desired charge transfer device can be provided, whose CCD width (the sum of the n-type well and the n+ regions on both sides) may be up to three times as large as the minimum design dimension, and whose maximum transferable charge is increased.

According to the manufacturing process of this invention, a p-type dopant may be ion-implanted from a direction tilted from the normal line of the substrate to the direction nonparallel to the charge transfer direction, to make the n-type well narrower, which may allow the CCD width to be further reduced.

In addition, in the process of this invention, a p-type dopant is ion-implanted using a photoresist for implantation of an n-type dopant, twice from directions tilted from the normal line of the substrate face to the right and left directions nonprallel to the charge transfer direction, to form an n+ region in a self-aligned manner. During the implantation, ions may be implanted from the right and the left directions tilted by the same angle, with the same energy and the same dosage, to form n+ regions with the same dimensions on the right and the left sides.

As described above, there can be provided a charge transfer device whose CCD has a width of up to three times as large as the minimum design dimension and which has an increased maximum transferable charge.

Thus, this invention can provide a compact charge transfer device which has a structure comprising an n+ region on at least one of two sides of an n-type well, has a large maximum transferable charge and has a CCD width up to three times as large as the minimum design dimension.

BRIEF DESCRIPTION OF THE DRAWINGS

FIGS. 2(a)–2(c) are schematic cross-sectional process views of the manufacturing process for the charge transfer device in the second embodiment of this invention.

FIG. 3(a) illustrates the channel potential distribution when the dopant concentration of the left p+ channel stopper is lower than that of the right p+ channel stopper and the right and the left n+ regions have the same width (prior art). FIG. 3(b) illustrates the channel potential distribution when the dopant concentration on the left p+ channel stopper is lower than that of the right p+ channel stopper and the left n+ region is narrower than the right region (this invention). The solid line indicates a distribution when both p+ channel stoppers (107, 110) have the same dopant concentration and both n+ regions (104a, 104b) have the same width.

FIGS. 6(a)–6(c) are explanatory figures for a charge transfer device, in which FIG. 6(a) is a schematic plan view, FIG. 6(b) a schematic cross section taken along line VI(b)–VI(b) of FIG. 6(a), and FIG. 6(c) is a schematic cross section taken along line VI(c)–VI(c) of FIG. 6(a).

DETAILED DESCRIPTION OF THE PREFERRED EMBODIMENTS

In the manufacturing process of this invention, it is preferable that when a p-type dopant is ion-implanted from a direction tilted from the normal line of the substrate face to the direction unparallel to the charge transfer direction to form a narrower n-type well, the center of the opening in the first photoresist during implantation of an n-type dopant in a manner that the n-type well is formed at the center line of the CCD is at a different position from the center line of the opening in the second photoresist during implantation of the p-type dopant.

In the manufacturing process of this invention, it is preferable that when the p+ channel stoppers around the n+ regions on the right and the left sides along the charge transfer direction of the n-type well have different dopant concentrations from each other, the n+region on the p+ channel stopper side with a lower dopant concentration has a narrower width or a lower dopant concentration.

To this end, it is preferable that the center line of the charge transfer direction for the photoresist opening into which the p-type dopant is ion-implanted is different from the center line of the CCD. Alternatively, in a process in which the p-type dopant is ion-implanted using the photoresist for implanting the n-type dopant, twice from directions tilted from the normal line of the substrate face to the right and left directions unparallel to the charge transfer direction to form the n+ region in a self-aligned manner, it may be preferable that the tilt angles during ion-implantation may be varied to provide a narrower n+ region on the side of the p+ channel stopper with a lower dopant concentration, or dosages from the right and the left may be different from each other to lower the dopant concentration of the n+ region on the p+ channel stopper side with a lower dopant concentration.

By reference to the accompanying drawings, some embodiments of this invention will be described, where a transferred charge is carried by electrons.

First Embodiment

Figure 6A:
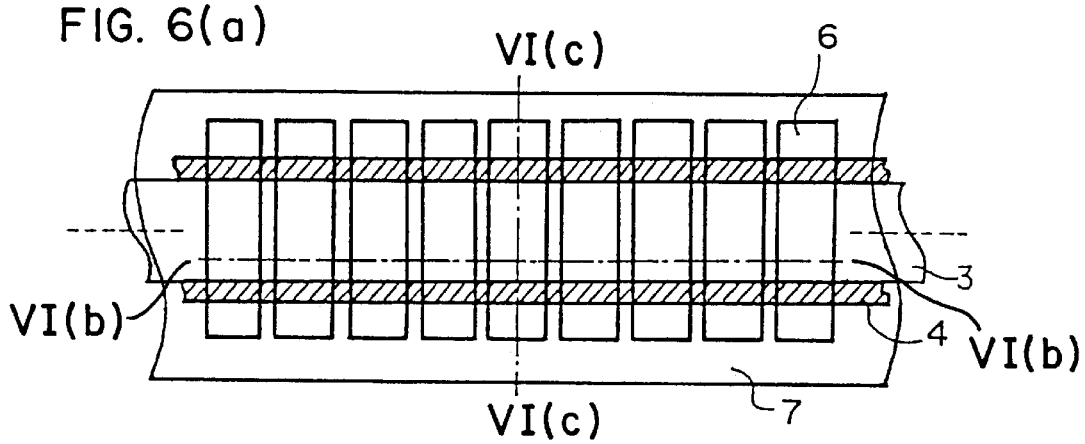
Figure 6B:
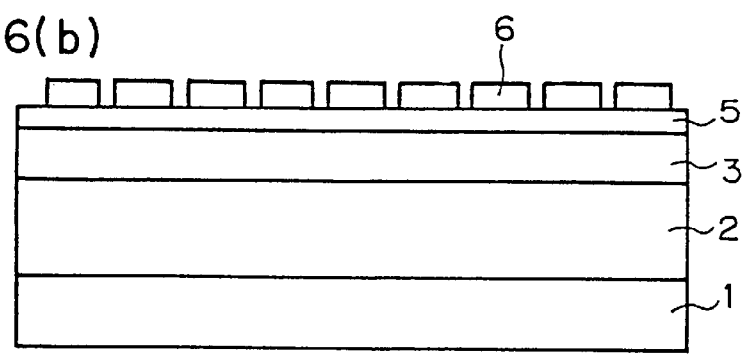
Figure 6C:
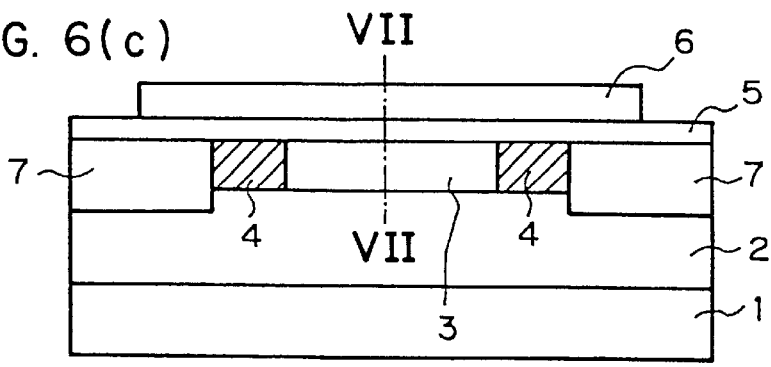
Figure 7:
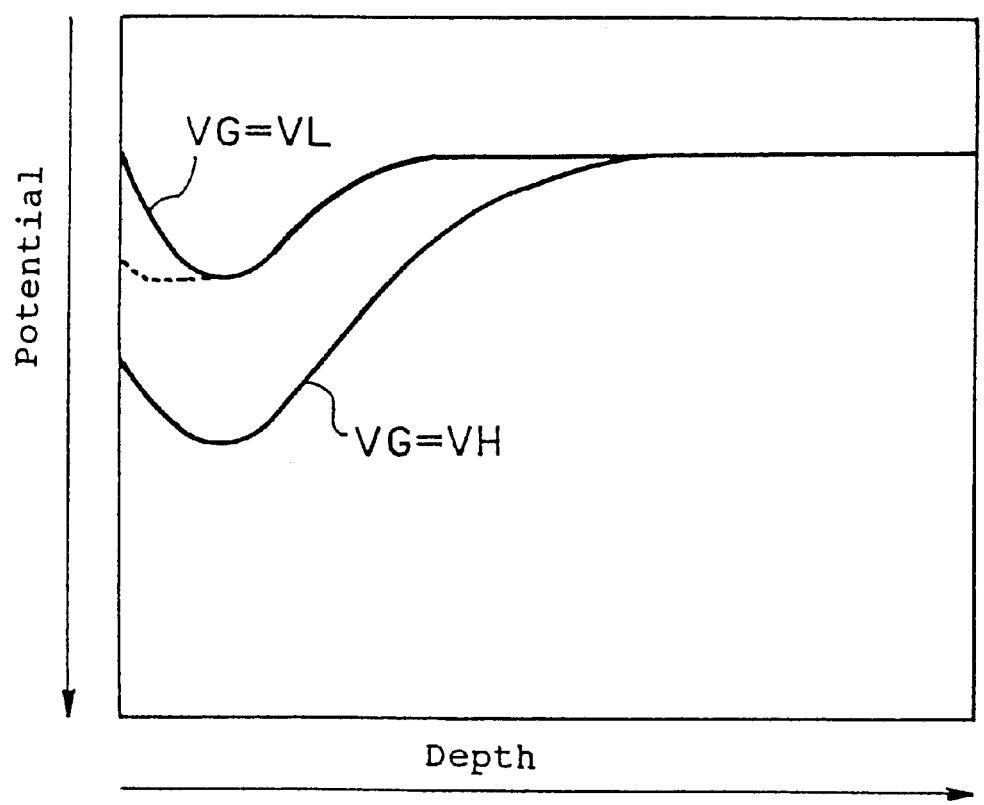
FIG. 7 shows an electric potential distribution along line VII–VII of FIG. 6(c), i.e., the depth direction, when a voltage is applied to the gate electrode.
Figure 8A:
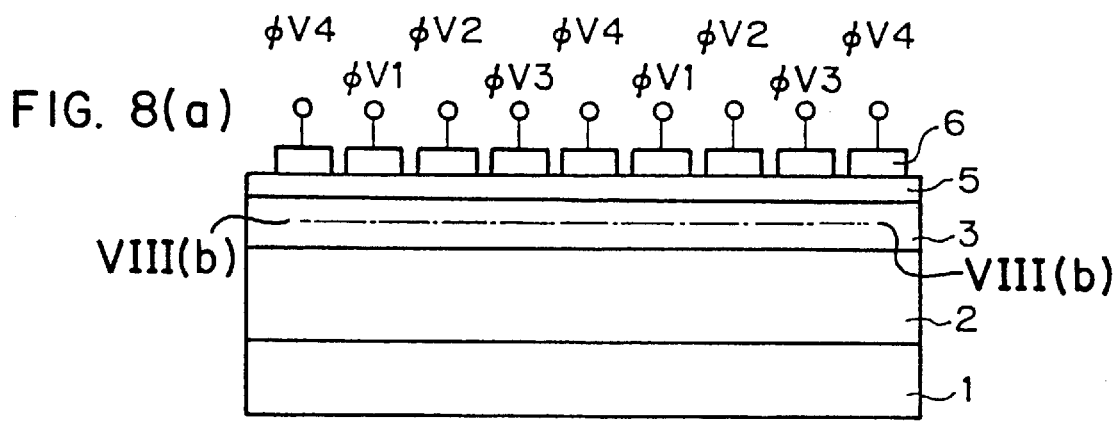
FIGS. 8(a)–8(c) illustrate a process for transferring charge with a charge transfer device.
Figure 8B:
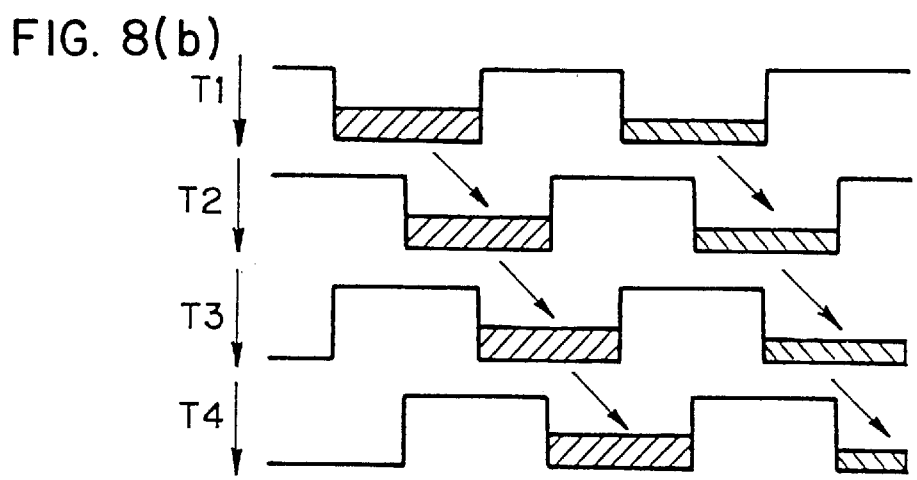
Figure 8C:
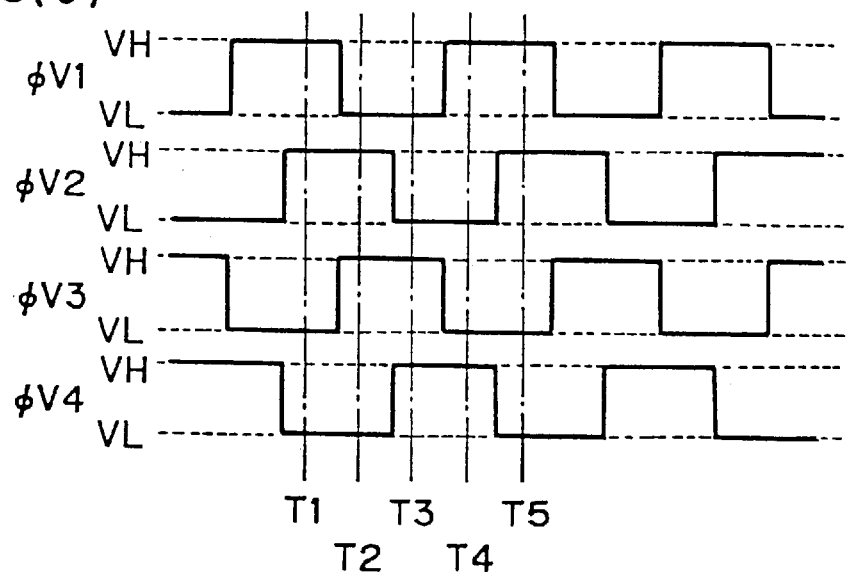
Figure 9A:
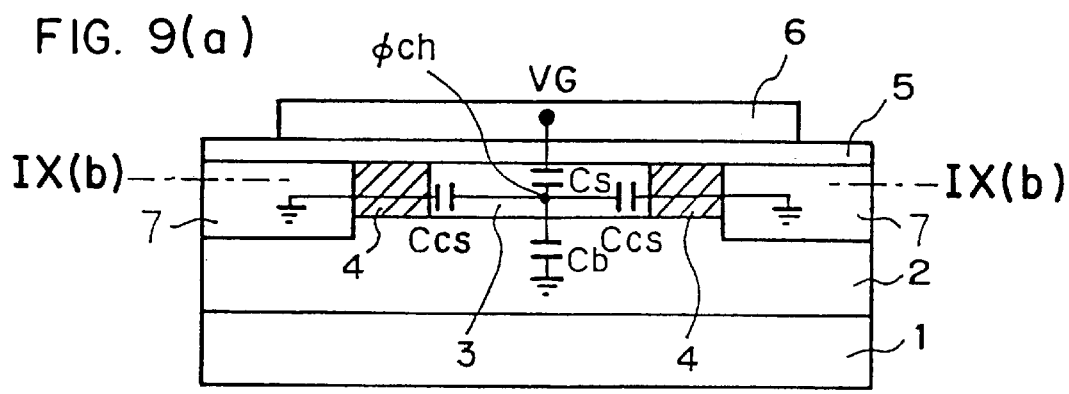
FIGS. 9(a)–9(b) illustrate the reason why a charge transfer device with an n+ region has a higher maximum transferable charge than one without an n+ region.
Figure 9B:
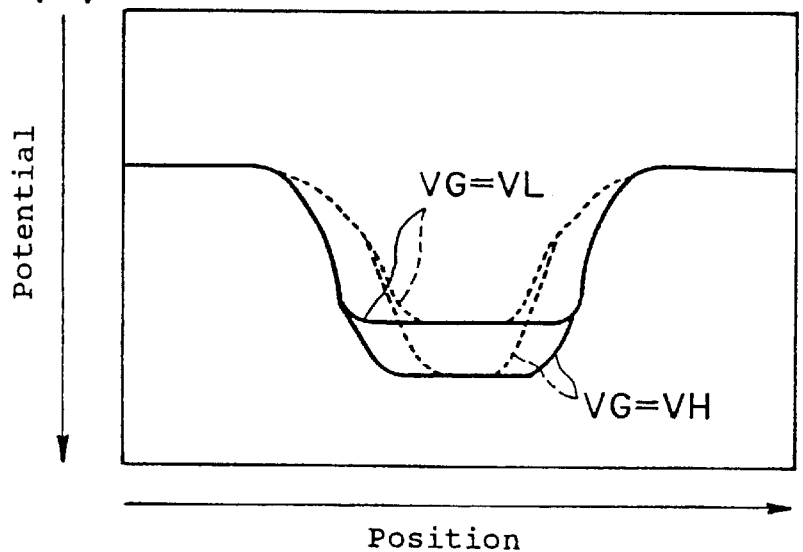

FIGS. 1(a)–1(d) are schematic cross-sectional process views for illustrating the first embodiment of the manufacturing process for a charge transfer device of this invention with an increased maximum transferable charge, showing the same cross section as that in FIG. 6(c). Other structural parts, a charge transfer procedure, and the reason for increase of the maximum transferable charge are as described for the prior art, and therefore will not be described.

Figure 1A:
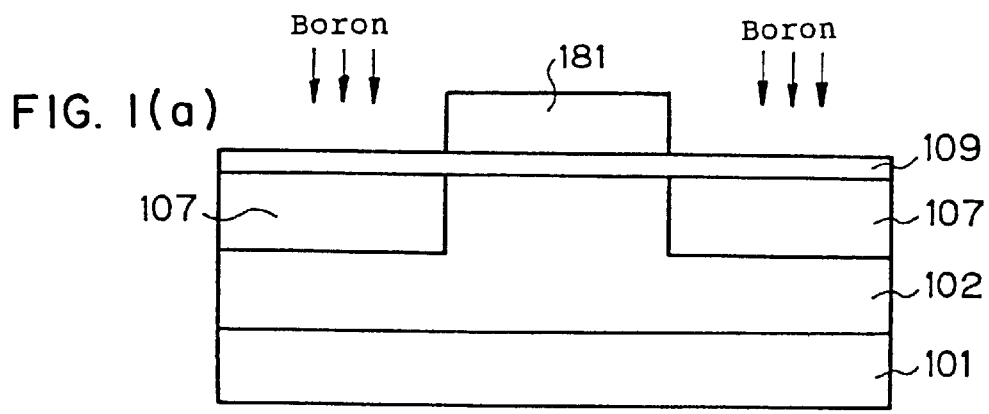
FIGS. 1(a)–1(d) are schematic cross-sectional process views of the manufacturing process for the charge transfer device in the first embodiment of this invention.

First, boron is ion-implanted with an energy of 150 to 200 keV and a dosage of 1 to $5 \times 10^{12}/cm^2$ on the surface of an n-type of silicon substrate 101 having a phosphorous concentration of an order of $10^{14}/cm^3$, a p-type well 102 is formed by heating at 1200° C. for 30 min to 2 hours; and then an oxide film 109 is formed by wet oxidation at 900° C. for about 7 min. As shown in FIG. 1(a), on the film is formed a photoresist 181 with a thickness of about 2 μm by a photolithography technique and then boron is ion-implanted with an energy of 20 to 40 keV and a dosage of 1 to $5 \times 10^{13}/cm^2$, to form a p+ channel stopper 107.

Figure 1B:
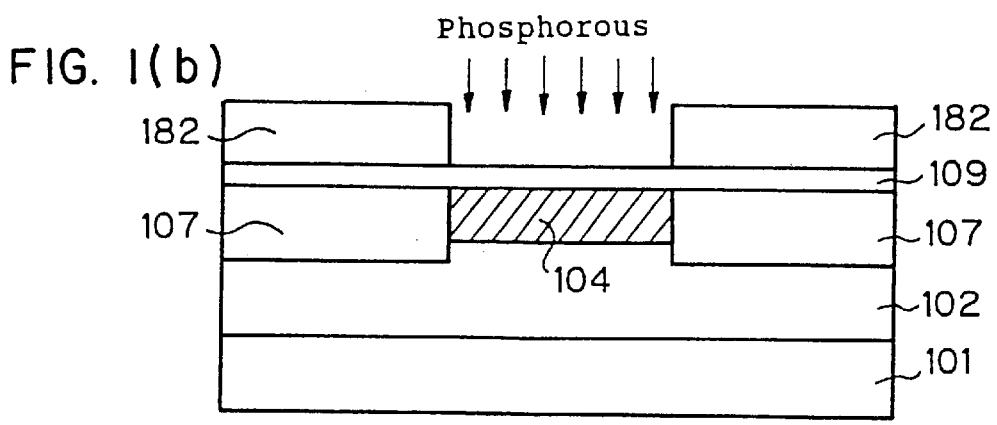

Next, after removing the photoresist 181, a photoresist 182 with a thickness of about 2 μm as shown in FIG. 1(b), and then phosphorous is ion-implanted with an energy of 70 to 150 keV and a dosage of 1.2 to $10 \times 10^{12}/cm^2$, to form an n+ region 104. The dosage is preferably 1.2 to 2 times as much as that for forming the n-type well 3 in the process of the prior art and the multiplying rate should be the same as the dopant concentration ratio of the n+ region/the n-type well. In brief, the dosage should be selected so as to attain a similar dopant concentration to that in the n+ region 4 in the prior art. Furthermore, the dosage should be selected so that the dopant concentration in the central part 103 is similar to that in the n-type well 3 in the prior art after a next ion-implantation of boron.

Figure 1C:
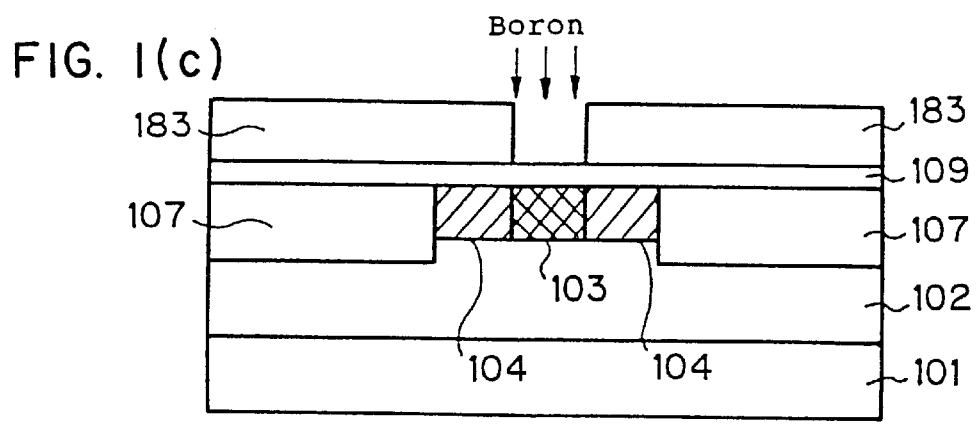

Next, after removing the photoresist 182, a photoresist 183 with a thickness of about 2 μm as shown in FIG. 1(c), and then boron is ion-implanted with an energy of 25 to 60 keV and a dosage of 0.2 to $5\times10^{12}/cm^2$, to form an n type well 103. The dosage of the boron implantation should be selected so that a value obtained by subtracting the p-type dopant concentration from the n-type dopant concentration in the central n+ region 104 is the substantially same as the n-type dopant concentration in the n-type well according to the process of the prior art. Since the difference between the n-type dopant and the p-type dopant concentrations affects the electric properties of the device, the difference is hereinafter referred to as a "substantial dopant concentration". In addition, the energy during ion-implanting should be preferably selected so that the peaks in the concentration distributions in the depth direction for phosphorous and boron substantially overlap.

Then, after removing the photoresist 183, the substrate is heated at 950 to 980° C. for 30 min to 1 hour under an atmosphere of nitrogen, to activate the ion-implanted dopant, and then the oxide film 109 is wet-etched with hydrofluoric acid.

Figure 1D:
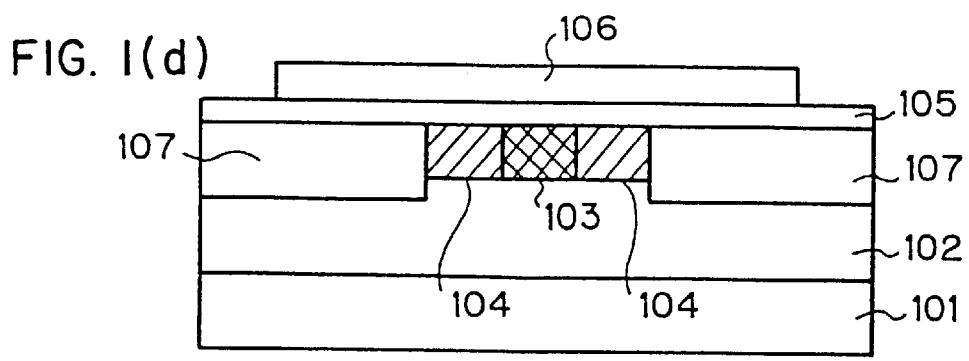

Then, as shown in FIG. 1(d), a gate insulator 105 is formed by wet oxidation at 900 to 980° C. for 5 to 30 min, on which a polysilicon gate electrode 106 doped with a dopant by lithography and etching, to provide a charge transfer device as shown in FIGS. 6(a)–6(c).

Figure 10A:
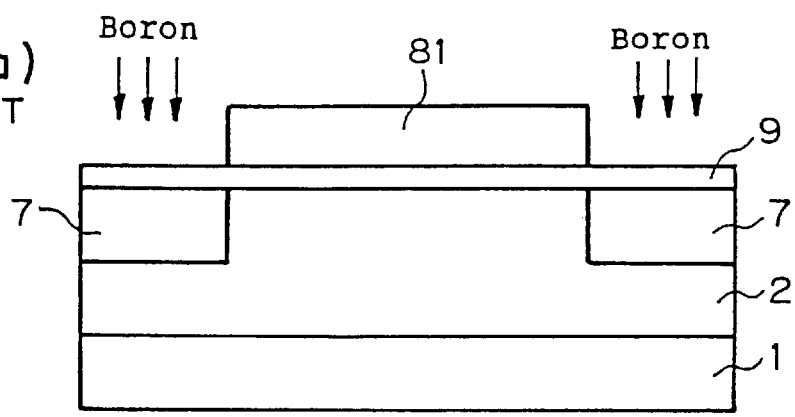
FIGS. 10(a)–10(d) are schematic cross-sectional process views of the manufacturing process for the charge transfer device of the prior art.
Figure 10B:
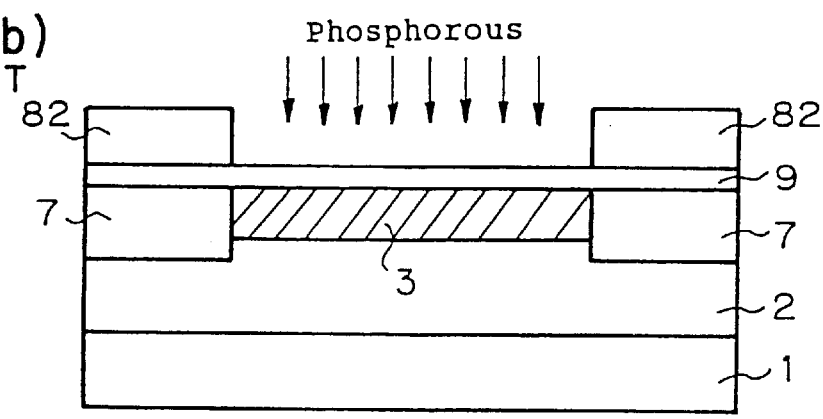
Figure 10C:
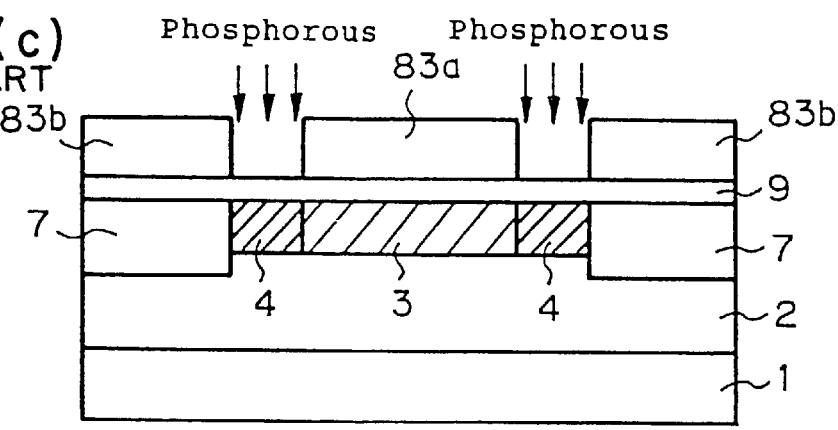
Figure 10D:
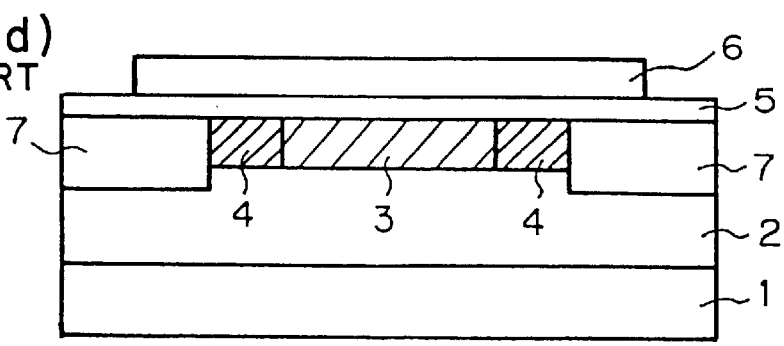

The photoresist 183 in the step in FIG. 1(c) is not narrow in contrast with the photoresist 83a in the prior art shown in FIG. 10(c), and therefore does not permit peeling or falling.

The size of the opening of the photoresist 183 may be reduced to the minimum design dimensions and the width of the n+ region depends on the positions of the openings in the p+ channel stopper 107 and the photoresist 183. Therefore, the width of the n+ region can be reduced to a dimension which is below the minimum design dimension and equal to or larger than the photoresist setting precision in the photolithography. The n+ region plays a role for making the curve(rate of change) of the channel potential steeper in the part, and the width can be reduced by increasing the concentration. Therefore, for example, when the minimum design dimension is 0.5 μm and the width of the n+ region on one side is 0.2 μm, the sum of the widths of the n-type well 103 and of both n+ regions is 0.9 μm. Thus, the manufacturing process of this invention can provide a charge transfer device with n+ regions on both sides of the n-type well eve n when the CCD has a width below three times the minimum design dimension.

As an improved variation of this embodiment, the CCD may be further narrowed by tilting the boron-implanting direction from the normal line of the substrate face to the direction unparallel to the charge transfer direction, to narrow a region subject to boron-implantation, i.e., the region of the n-type well 103, and moving the outer end of one(right or left) n+ region toward the n-type well to make the widths of both sides of n+ regions equal. In the case, the center line of the opening in the photoresist 182 is at a different position from the center line of the opening in the photoresist 183.

Second Embodiment

FIGS. 2(a)–2(c) are schematic cross-sectional process views for illustrating the second embodiment, showing a manufacturing process—for a charge transfer device in which p+ channel stoppers on both sides of the n+ region have different dopant concentrations from each other. FIGS. 2(a)–2(c) depict the process with a similar cross section to FIG. 6(c), and uses the same symbols as those in the first embodiment shown in FIGS. 1(a)–1(d) for the same structural parts.

This embodiment is different from the first embodiment shown in FIGS. 1(a)–1(d) in that the left p+ channel stopper 110 has a lower dopant concentration than that in the right p+ channel stopper 107, that in the step of FIG. 2(b) the boron-implantation area in the n+ region 104 is not the center part of the n+ region 104, but is extended or moved toward one p+ channel stopper 110.

Thus, the width of the left n+ region 104a is narrower than that of the right n+ region 104b. A difference between the widths of the right and the left n+ regions is a function of the dopant concentrations of the n+ regions, and it is preferable that the width of the left n+ region 104a is narrower than that of the right n+ region 104b by about 0.1 to 0.3 μm, for which a setting process will be described later.

The manufacturing process for a charge transfer device shown in FIGS. 2(a)–2(c) comprises the same steps as those in the first embodiment shown in FIGS. 1(a)–1(d) except the step for forming p+ channel stoppers 107 and 110 with different dopant concentrations and a different position of the photoresist 183 in the step shown in FIG. 2(b). The process will not be, therefore, described.

Figure 11:
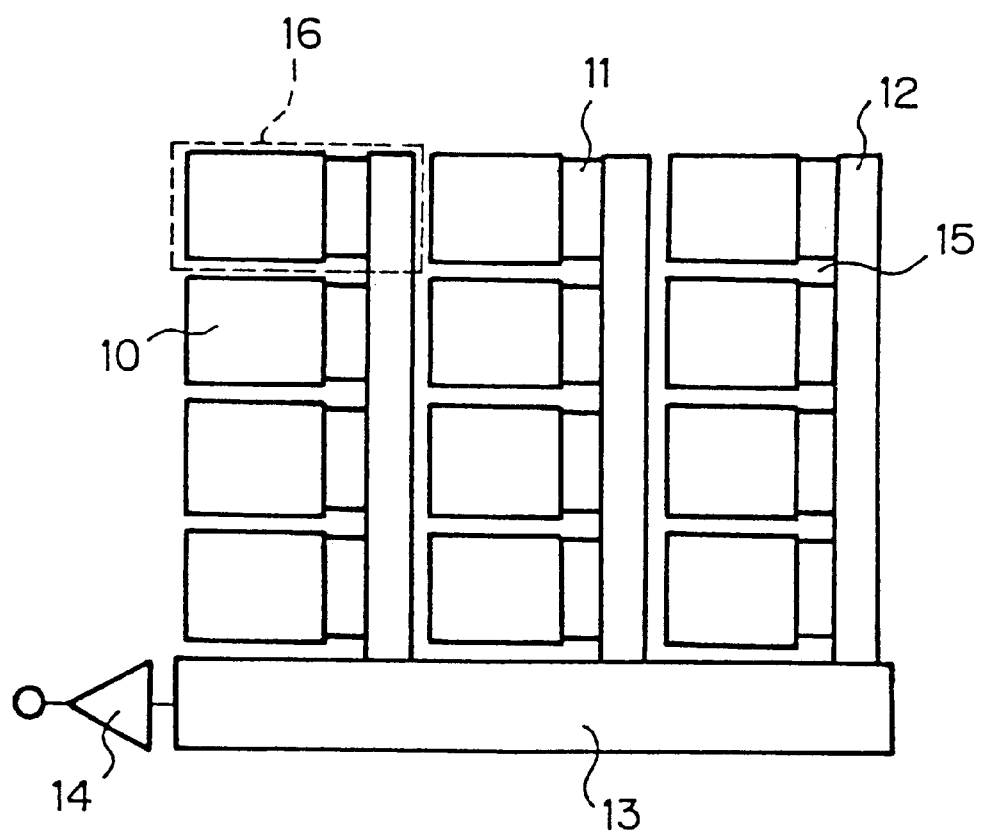
FIG. 11 is a schematic explanatory figure of a two-dimensional CCD image sensor.

A structure in which p+ channel stoppers of a CCD on both sides have different dopant concentrations from each other, can be observed in, for example, the CCD image sensor shown in FIG. 11, in which a transfer gate is connected with one side of a vertical CCD. The transfer gate is composed of a p-type semiconductor consisting of an enhancement type transistor of an n channel, whose threshold voltage is 0 to 1 V and whose p-type dopant concentration is lower than that of the p+ channel stopper by at least one order and in the same order as the n-type well.

Figure 3A:
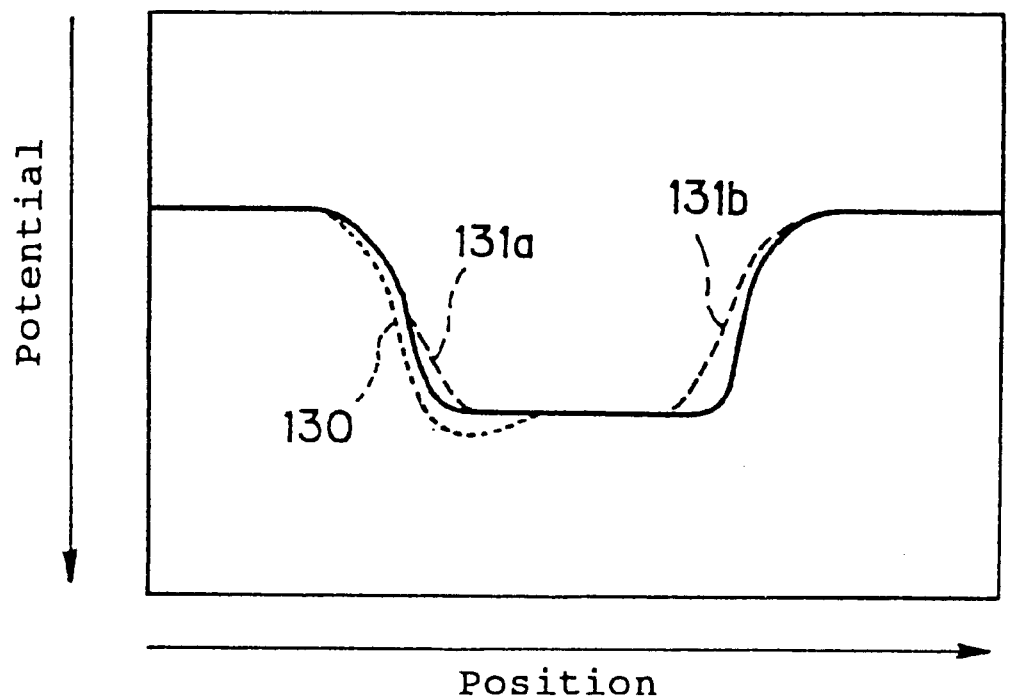
FIGS. 3(a) and 3(b) shows a channel potential distribution taken along line III–III of FIG. 2(c).
Figure 3B:
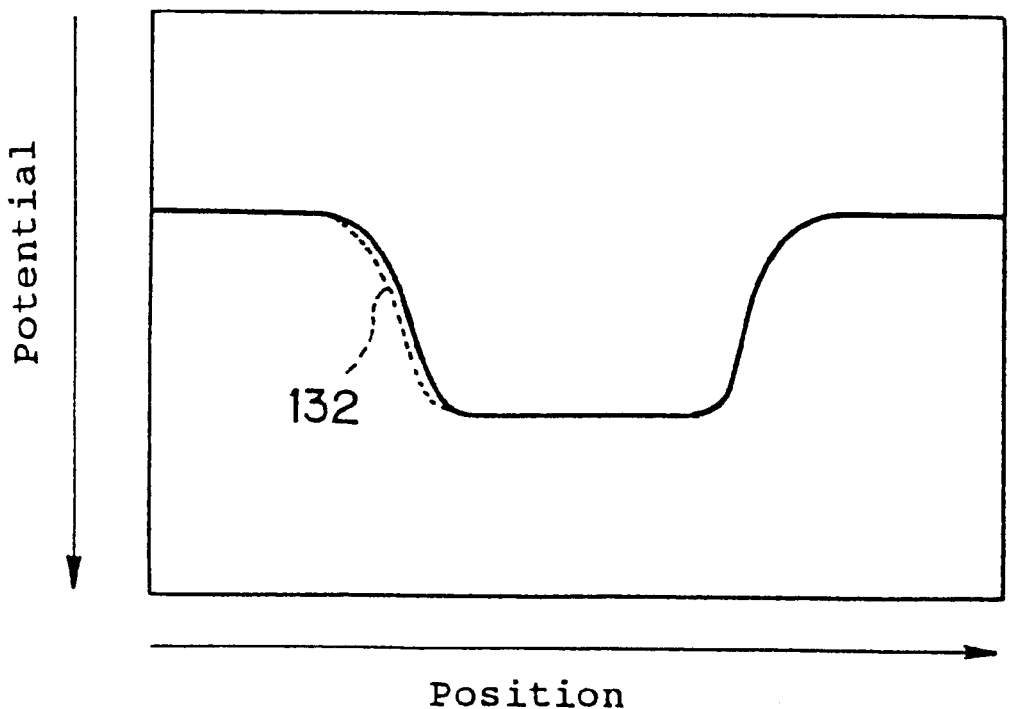

FIGS. 3(a) and 3(b) show a channel potential distribution along line III—III of FIG. 2(c) when a lower voltage (VL) is applied to the gate electrode and the dopant concentration of the left p+ channel stopper 110 is lower than that of the right p+ channel stopper 107. Specifically, FIGS. 3(a) and 3(b) show distributions when the n+ regions 104a and 104b have the same width and when the n+ region 104a is narrower than the n+ region 104b in this embodiment, respectively, where the solid line indicates a distribution when both p+ channel stoppers (107, 110) have the same dopant concentration and both n+ regions (104a, 104b) have the same width.

The dotted line 130 in FIG. 3(a) indicates a channel potential distribution when the left p+ channel stopper(110) has a lower dopant concentration and both n+ regions(104a, 104b) have the same width, where a channel potential curve around the right p+ channel stopper is represented by the sold line. When the dopant concentration in the left p+ channel stopper is reduced to the same order as that in the n+ region, the depletion layer in the n+ region is reduced and the channel potential depends on p-n junction with the p-type well rather than p-n junction with the p+ channel stopper. When the channel potential depends on p-n junction with the p-type well, and when the n+ region and the n-type well are depleted, the channel potential is increased due to a higher phosphorous concentration in the n+ region, resulting in a potential dip in the n+ region 104a (see the dotted line 130). Formation of such a dip leads to increase of a drive amplitude because when the depth of the n-type well is constant, a higher dopant concentration leads to a lower gate voltage required to store positive holes in a silicon/oxide film interface (pinning voltage).

The dotted lines 131a and 131b in FIG. 3(a) indicate channel potential distributions in the n+ region when the dopant concentration in the region is reduced to avoid formation of such a potential dip in the left n+ region. As seen in this figure, reduction of the dopant concentration in the n+ region makes the potential curve gentler and the flat part of the channel potential narrower, leading to reduction of Cs (i.e., a capacity between the channel position and the gate electrode) and Qmax.

When the left n+ region 104a is narrower than the right n+ region 104b with keeping the dopant concentration in the n+ region constant as the embodiment of FIGS. 2(a)–2(c) shows, a potential dip does not appear and the flat part of the channel potential is not reduced as shown in FIG. 3(b) (the dotted line 132). A difference between the widths of the right and the left n+ regions is a function of the dopant concentrations of the n+ regions, and it is preferable that the width of the left n+ region 104a is narrower than that of the right n+ region 104b by about 0.1 to 0.3 μm, by which a charge transfer device with an increased Qmax can be provided.

Third Embodiment

FIGS. 4(a)–4(e) are schematic cross-sectional process views for illustrating the third embodiment of the manufacturing process for a charge transfer device with an increased maximum transferable charge, showing the same cross section as that in FIG. 6(c). Other structural parts, a charge transfer procedure, and the reason for increase of the maximum transferable charge are as described for the prior art, and therefore will not be described. The same symbols as those in the first embodiment shown in FIGS. 1(a)–1(d) are used for the same structural parts.

This embodiment is different from the first embodiment shown in FIGS. 1(a)–1(d) in that the n+ region 142 is formed using the photoresist 182 for forming the n-type region rather than a dedicated photoresist and that boron is ion-implanted from an oblique direction to the opening of the photoresist 182, whereby the n+ region can be formed without shift from the n-type well.

Figure 4A:
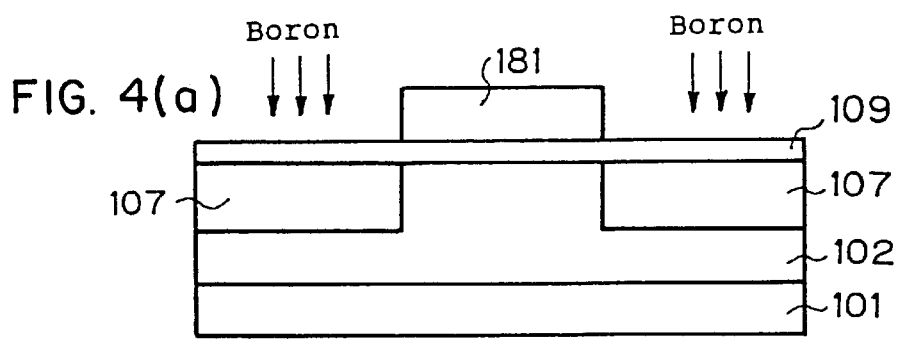
FIGS. 4(a)–4(e) are schematic cross-sectional process views of the manufacturing process for the charge transfer device in the third embodiment of this invention.

First, boron is ion-implanted with an energy of 150 to 200 keV and a dosage of 1 to $5 \times 10^{12}/cm^2$ on the surface of an n-type of silicon substrate 101 having a phosphorous concentration of an order of $10^{14}/cm^3$; a p-type well 102 is formed by heating at 1200° C. for 30 min to 2 hours; and then an oxide film 109 is formed by wet oxidation at 900° C. for about 7 min. As shown in FIG. 4(a), on the film is formed a photoresist 181 with a thickness of about 2 μm by a photolithography technique and then boron is ion-implanted with an energy of 20 to 40 keV and a dosage of 1 to $5 \times 10^{13}/cm^2$, to form a p+ channel stopper 107.

Figure 4B:
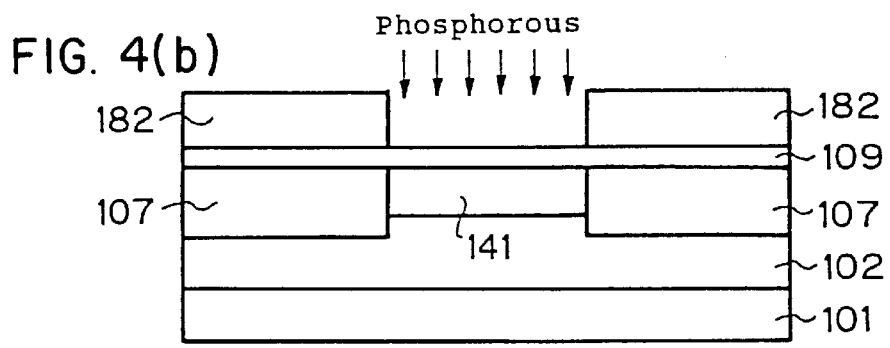

Next, after removing the photoresist 181, a photoresist 182 with a thickness of about 2 μm is formed as shown in FIG. 4(b), and then phosphorous is ion-implanted with an energy of 70 to 150 keV and a dosage of 1.4 to $15 \times 10^{12}/cm^2$, to form an n+ region 141. The dosage is preferably 1.4 to 3 times as much as that for forming the n-type well 3 in the process of the prior art. The multiplying rate may be represented by "2a-1" when it is desired to attain the substantial dopant concentration of the n+ region "a" times as much as that in the n-type well. It is preferable that the dosage is selected so as to attain a similar substantial dopant concentration in the central part 144 to that in the n-type well 3 in the prior art.

Figure 4C:
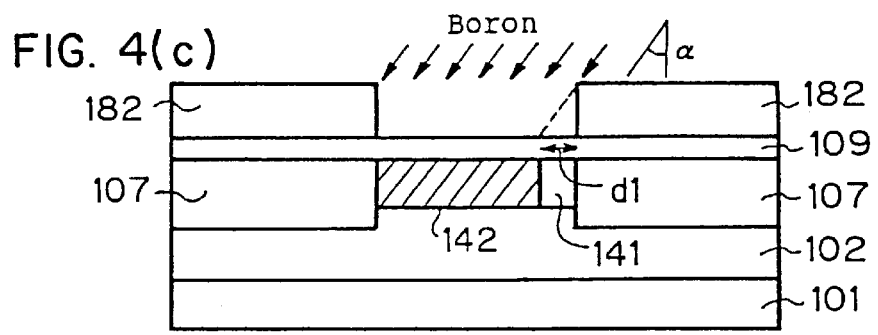

Next, using the same photoresist 182, boron is ion-implanted with an energy of 25 to 60 keV and a dosage of 0.2 to $5 \times 10^{12}/cm^2$ from a direction tilted from the vertical direction to the left by 5 to 20° (indicated by α in this figure) as shown in FIG. 4(c), to form an n+ region 142 in which the n-type dopant is diluted by the p-type dopant. The dosage should be selected so that the substantial dopant concentration in terms of the electric properties of the n+ region 142 is similar to that of the n+ region 4 in the structure of the prior art. It is preferable that the energy in the ion implantation is selected so that the peaks of the concentration distributions in the depth direction for phosphorous and boron substantially overlap. In this case, the region to a distance d1 from the right end of the opening in the photoresist is not subject to boron-implantation, leaving the n+ region 141. The distance d1 may be determined by the following equation:

$$d1 = L \cdot \tan \alpha \qquad (2)$$

where L represents the sum of the thickness of the photoresist and the thickness of the oxide film 109. The distance d1 may be, therefore, controlled by the thickness L and the incident angle α.

Figure 4D:
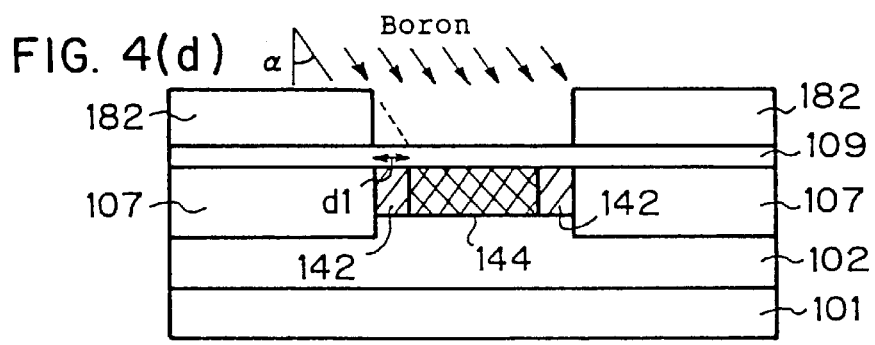

Then, using the same photoresist 182, boron is ion-implanted as shown in FIG. 4(d) with the same energy and dosage as those in the step shown in FIG. 4(c) from the direction tilted from the vertical direction to the right by the same angle(indicated by α in this figure) as that in the step shown in FIG. 4(c), to form an n-type well 144 in which the n-type dopant is further diluted by the p-type dopant. The substantial dopant concentration in terms of the electric properties of the n-type well 144 is similar to that of the n-type well 3 according to the prior art.

The distance from the left end of the opening of the photoresist where is not subject to boron implantation due to the photoresist 182 is the same as d1 in the step shown in FIG. 4(c). The substantial dopant concentration in the area to the distance d1 from the left end of the opening of the photoresist is the same as that in the n+ region 142 in FIG. 4(c). The substantial dopant concentration in the area to the distance d1 from the right end of the opening of the photoresist is diluted by the boron implantation shown in this figure to also become the same as that in the n+ region 142 in FIG. 4(c).

Then, after removing the photoresist 182, the substrate is heated at 950 to 980° C. for 30 min to 1 hour under an atmosphere of nitrogen, to activate the ion-implanted dopant, and then the oxide film 109 is wet-etched with hydrofluoric acid.

Figure 4E:
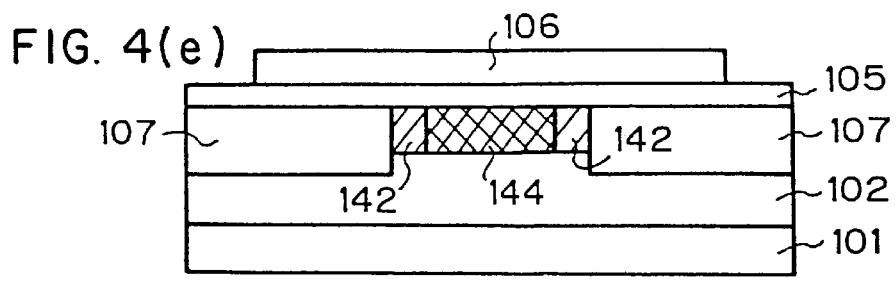

Then, as shown in FIG. 4(e), a gate insulator 105 is formed by wet oxidation at 900 to 980° C. for 5 to 30 min, on which a polysilicon gate electrode 106 doped with a dopant by photolithography and etching, to provide a charge transfer device as shown in FIGS. 6(a)–6(c).

The photoresist 182 in the step in FIGS. 4(b) to 4(d) is not narrow in contrast with the photoresist 83a in the prior art shown in FIG. 10(c), and therefore does not permit peeling or falling.

The size of the opening of the photoresist 182 may be reduced to the minimum design dimensions and the width of the n+ region depends on the thickness L and the boron incident angle α. The n+ region plays a role for making the curve(rate of change) of the channel potential steeper in the part, and the width can be reduced by increasing the substantial dopant concentration. Therefore, the sum of the widths of the n-type well 144 and of both n+ regions 142 can be reduced to the minimum design dimension. Thus, the manufacturing process of this invention can provide a charge transfer device with n+ regions on both sides of the n-type well even when the CCD has a width below three times the minimum design dimension.

In the steps of FIGS. 4(c) and 4(d), boron is ion-implanted from a direction tilted from the normal line of the substrate face to one direction vertical to the charge transfer direction. But boron may be ion-implanted from a direction tilted from the normal line of the substrate face to one direction unvertical to the charge transfer direction as far as the direction has a component of vertical direction to the charge transfer direction. That is to say, boron may be ion-implanted from a direction tilted from the normal line of the substrate face to one direction unparallel to the charge transfer direction.

Fourth Embodiment

FIGS. 5(a)–5(d) are schematic cross-sectional process views for illustrating the fourth embodiment of the manufacturing process of this invention, showing a manufacturing process for a charge transfer device in which p+ channel stoppers on both sides of the n+ region have different dopant concentrations from each other. FIGS. 5(a)–5(d) depict the process with a similar cross section to FIG. 6(c), and use the same symbols as those in the third embodiment shown in FIGS. 4(a)–4(e) for the same structural parts.

Figure 5A:
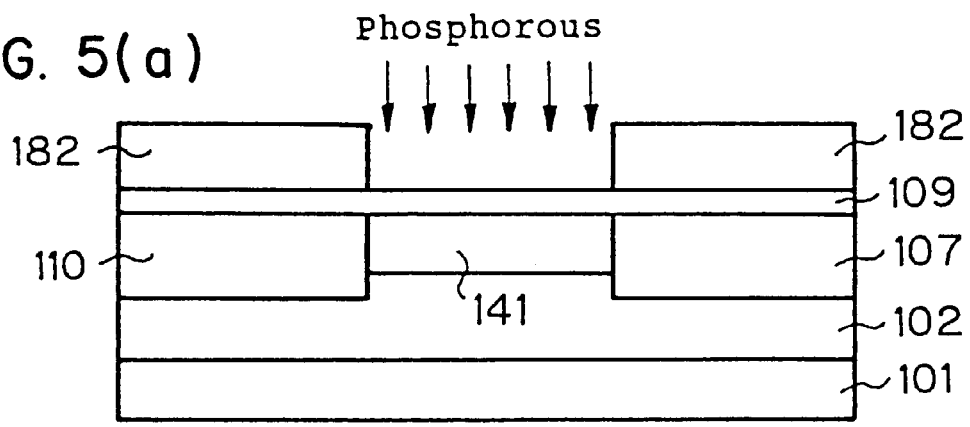
FIGS. 5(a)–5(d) are schematic cross-sectional process views of the manufacturing process for the charge transfer device in the fourth embodiment of this invention.
Figure 5B:
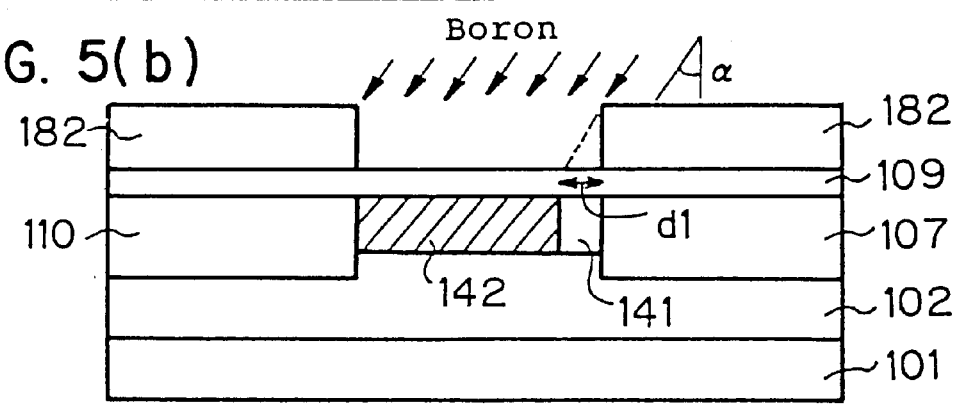
Figure 5C:
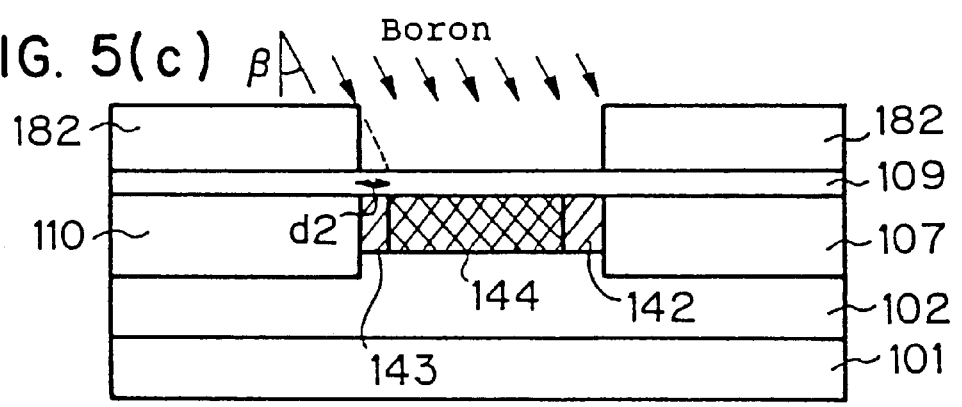
Figure 5D:
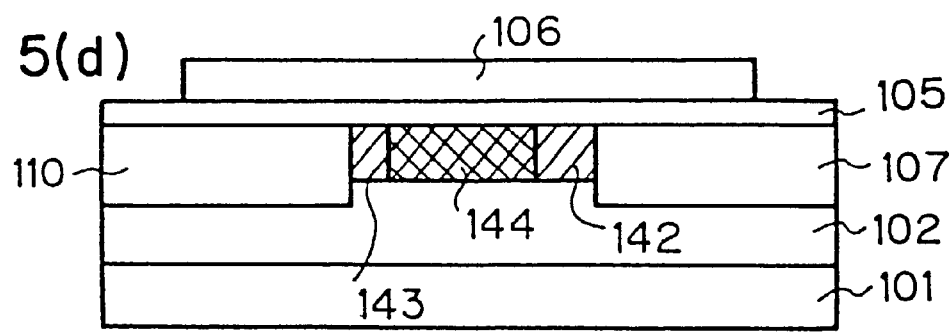

This embodiment shown in FIGS. 5(a)–5(d) is different from the third embodiment shown in FIGS. 4(a)–4(e) in that the left p+ channel stopper 110 has a lower dopant concentration than that in the right p+ channel stopper 107 and that in the step of FIG. 5(c) a boron incident angle β is smaller than the incident angle α in the step shown in FIG. 5(b), and the distance d2 to which boron is not implanted due to the photoresist 182 is shorter than the distance d1 in the step shown in FIG. 5(b).

Thus, the width of the left n+ region 143 is narrower than that of the right n+ region 142. A difference between the widths of the right and the left n+ regions is a function of the dopant concentrations of the n+ regions, and it is preferable that the width of the left n+ region 143 is narrower than that of the right n+ region 142 by about 0.1 to 0.3 μm, for which the setting process has been described for the second embodiment. Thus, a charge transfer device with an increased Qmax can be provided without increase in a driving voltage.

The manufacturing process for a charge transfer device shown in FIGS. 5(a)–5(d) is different from the third embodiment shown in FIGS. 4(a)–4(e) only in the fact that the boron incident angle β in the step shown in FIG. 5(c) is smaller than the incident angle α in the step shown in FIG. 5(b). The process will not be, therefore, described.

Since in this embodiment the distance to which boron is not implanted due to the photoresist may be estimated by Equation (2), an incident angle β for providing a desired distance d2 may be readily calculated.

In the third embodiment shown in FIGS. 4(a)–4(e) (for the incident angles α=β), when the dopant concentration in the left p+ channel stopper 110 is lower than that in the right p+ channel stopper 107 as is in this embodiment shown in FIGS. 5(a)–5(d), the boron dosage in the step of FIG. 4(d) may be lower than that in the step of FIG. 4(c), to provide a charge transfer device exhibiting a channel potential curve without a potential dip as indicated by the dotted line 131a in the left side area of the potential distribution and the solid line in the right side area of the potential distribution in FIG. 3(a). This procedure may be also applied to the steps of FIGS. 5(b) and 5(c) in the fourth embodiment. replacement paragraph:

In the steps of FIGS. 5(b) and 5(c), boron is ion-implanted from a direction tilted from the normal line of the substrate face to one direction vertical to the charge transfer direction. But boron may be ion-implanted from a direction tilted from the normal line of the substrate face to one direction unvertical to the charge transfer direction as far as the direction has a component of vertical direction to the charge transfer direction. That is to say, boron may be ion-implanted from a direction tilted from the normal line of the substrate face to one direction unparallel to the charge transfer direction.

As described above, the n+ regions are formed on both sides of the n-type well, but it will be clearly understood that the above description may be also applied to the case where an n+ region is formed on one side of an n-type well, although in such a case a maximum transferable charge will be lower than that when the n+ regions are formed on both sides.

Arsenic may be implanted in place of phosphorous as described above for forming an n-type. In the above description, a charge is carried by electrons, but when positive holes carry a charge this invention may be applied by interchanging n-type and p-type dopants and reversing the direction of an applied voltage. A gate insulator is not limited to an oxide film, and may be a multilayer of oxide and nitride films. The gate electrode is a single layer in the above description, but it may be an overlapped electrode where 2 or 3 layers of polysilicon gate electrodes are multilayer and overlap in part. Furthermore, this invention may be applied to not only four-phase but also two- or three-phase charge transfer systems.

What is claimed is:

1. A charge transfer device comprising a well of second conduction type for transferring a signal charge, formed in a well of first conduction type on a semiconductor substrate, first and second regions of second conduction type respectively formed directly on first and second sides in a horizontal direction along a charge transfer direction of the well of second conduction type and containing a dopant in a higher concentration than that in the well of second conduction type, first and second regions of first conduction type having different dopant concentrations and respectively formed around the first and second regions of second conduction type, and a gate electrode covering at least the well of second conduction type and the first and second regions of second conduction type and formed via a gate insulator, wherein the first region of second conduction type on the side of the first region of first conduction type with a lower dopant concentration than that of the second region of first conduction type is narrower than the second region of second conduction type.

2. A charge transfer device comprising a well of second conduction type formed for transferring a signal charge, in a well of first conduction type on a semiconductor substrate, first and second regions of second conduction type respectively formed directly on first and second sides in a horizontal direction along a charge transfer direction of the well of second conduction type and containing a dopant in a higher concentration than that in the well of second conduction type, first and second regions of first conduction type having different dopant concentrations and respectively formed around the first and second regions of second conduction type, and a gate electrode covering at least the well of second conduction type and the first and second regions of second conduction type and formed via a gate insulator, wherein the first region of second conduction type on the side of the first region of first conduction type with a lower dopant concentration than that of the second region of first conduction type has a lower dopant concentration than that of the second region of second conduction type.

3. The charge transfer device as claimed in claim 1, wherein the first region of second conduction type has the same dopant concentration as that of the second region of second conduction type.

4. The charge transfer device as claimed in claim 1, wherein the first region of second conduction type on the side of the first region of first conduction type with a lower dopant concentration than that of the second region of first conduction type has a lower dopant concentration than that of the second region of second conduction type.

* * * * *